United States Patent [19]

Sukegawa et al.

[11] Patent Number: 5,293,564
[45] Date of Patent: Mar. 8, 1994

[54] ADDRESS MATCH SCHEME FOR DRAM REDUNDANCY SCHEME

[75] Inventors: Shunichi Sukegawa, Ibaraki, Japan; Hiep V. Tran, Carrollton, Tex.

[73] Assignee: Texas Instruments Incorporated, Dallas, Tex.

[21] Appl. No.: 693,757

[22] Filed: Apr. 30, 1991

[51] Int. Cl.⁵ .................. G11C 7/00; G11C 13/00
[52] U.S. Cl. .................. 365/200; 365/225.7
[58] Field of Search ............ 365/200, 225.7, 230.06

[56] References Cited

U.S. PATENT DOCUMENTS

| | | | |
|---|---|---|---|
| 4,714,839 | 12/1987 | Chung | 365/200 X |
| 4,729,117 | 3/1988 | Osaka | 365/200 |
| 4,754,434 | 6/1988 | Wang et al. | 365/200 |
| 4,791,319 | 12/1988 | Tagami et al. | 365/200 X |
| 4,829,480 | 5/1989 | Seo | 365/200 |
| 4,860,256 | 8/1989 | Devin et al. | 365/200 X |
| 4,860,260 | 8/1989 | Saito et al. | 365/200 X |
| 5,107,464 | 4/1992 | Sahara et al. | 365/200 |

Primary Examiner—Eugene R. LaRoche
Assistant Examiner—Do Hyun Yoo
Attorney, Agent, or Firm—Peter T. Rutkowski; Stanton C. Braden; Richard L. Donaldson

[57] ABSTRACT

An address match scheme is disclosed which allows the alternate selection of fuses blown based on either logic ones or logic zeros in an address.

3 Claims, 5 Drawing Sheets

ADDRESS MATCH SCHEME FOR DRAM REDUNDANCY SCHEME

BACKGROUND OF THE INVENTION

Electronic devices and systems such as printers, copiers, electronic storage devices (memories) high definition television, enhanced definition television and computational devices (e.g. calculators and computers including personal computers, minicomputers, personal computers and microcomputers) requiring electronic storage devices, often provide data storage on an integrated circuit chip. Because these devices often require large amounts of storage space for many applications, these storage devices are embodied in memory, for instance, a dynamic random access memory (DRAM). Memory cells sometimes contain or are associated with defects. It is therefore necessary to replace this defect memory or defect associated memory with memory from alternate memory cells commonly referred to as redundant memory. Once defective memory is detected the address corresponding to this memory is noted and before the memory is used, the mechanism for implementing the redundant memory cells is usually embodied in a system based on blowing fuses. The scheme for producing a signal indicative of the desire to use the redundant memory or rather to match the address of the defective memory is of extreme importance. The redundancy scheme, particularly the address match scheme, forms an integral part of the dynamic random access memory. The address match scheme is also an integral part of the above described devices and systems, supplying substantial value to these and other devices and systems in which it is used.

Address match schemes in the past have been used wherein a fuse associated with a given bit position of an address is blown located in the path between a selected transistor from a plurality of transistors and a common node between the transistors. The fuse blown corresponds to a particular logic state of the address. For instance, fuses can be blown corresponding to the logic ones in an address. Alternatively, but not interchangeably within the scheme, fuses can be blown corresponding to the logic zeros in an address. FIG. 1 illustrates a prior art address match scheme for a 4 megabit (4 meg) DRAM. A plurality of n-channel transistors 2 is illustrated with each transistor connected at its drain to a fuse 4. A plurality of inverters 6 are illustrated with each inverter connected to an associated gate of a transistor from the plurality of transistors 2. The input to each inverter 6 is denoted by labeling address factors F0 through F23 and nodes for receiving address bits A12 and A_12. The character _ used throughout in connection with a label herein indicates a node which receives the complement of a signal going to or coming from the node without such a character. Consequently, bit A12 receives the complement of the signal going to bit A_12 and vice versa. Each fuse 4 is connected to the input of inverter 8 whose output is capable of transmitting a signal in connection with the activation of a redundant row of memory. Pull-up p-channel transistor 10 is connected by its gate to the output of inverter 12 whose input is connected to each fuse 4 and the input of inverter 8.

The left half of FIG. 1 illustrates a schematic drawing of the logic circuit used in determining the signals used at nodes representing address factors F0 through F23. Complemented address signals from address bits A_0 through A11 are received by NAND gates 14 as shown. Every address bit from a set of two address bits and the complements of those address bits are NANDed together as shown resulting in 4 address factors for input into inverters 6.

Since every address and its complement from a set are NANDed together, only one such combination (the one with logic high inputs to a NAND gate) of NANDed addresses produces a logic low output as an address factor. The inverter from the plurality of inverters 6, which receives the logic low address factor signal will energize the gate of the associated transistor from the plurality of transistors 2. In order to activate a redundant row of memory cells the input of inverter 8 must remain at around roughly one transistor 10 threshold voltage drop below voltage Vdd, or rather at a voltage corresponding to a logic high. Output OUT at inverter 8 will output a logic low signal in connection with activating a redundant row of memory. Therefore, fuse 4 associated with the energized gate of a transistor from the plurality of transistors 2, must be blown to keep the input to inverter 8 a logic high. Thus, as shown in FIG. 1 one fuse 4 associated with a set of four address factors must be blown in order to ensure that the redundancy row is activated. For the 4 megabit memory address scheme, there are 6 sets of four address factors, thus 6 fuses must be blown in order to activate the redundancy row. Additionally, in order to activate any redundancy row, fuses 4 for address bits A12 or A_12 must be blown as dictated by the most significant bit of the address in which redundancy is sought. Consequently if the most significant bit of the address is a logic 1, then fuse 4 corresponding to address bit A12 must be blown. Likewise, if the most significant bit of the address is a logic 0, then fuse 4 corresponding to address bit A_12 must be blown. As a result, a total of 7 fuses must be blown in the 4 megabit address match scheme illustrated in FIG. 1.

FIG. 2 illustrates a prior 16 megabit (16 meg) DRAM type address match scheme. This scheme is similar to the 4 meg scheme discussed above. However, the scheme shown in FIG. 2 uses the plurality of fuse circuits illustrated. In the fuse circuits shown in FIG. 2, field effect transistor 14 is connected to field effect transistors 16, 18, and 20. Additionally, the fuse circuits comprise inverter 22 connected to fuse 24. Transistor 20 receives an address bit signal at one of its terminals while transistor 18 receives the complement of this address bit signal at one of its terminals. Transistors 18 and 20 generally have a lower threshold voltage than the other transistors shown in FIG. 2. In an effort to activate a redundancy memory cell corresponding to a selected address, fuse 24 is blown when the selected address bit corresponding to the signal sent to transistor 20 is a logic 1 or rather a logic high value. However, fuse 24 is not blown when the address bit corresponding to the signal sent to transistor 20 is a logic 0 or rather a logic low value. Note that when fuse 24 is not blown, the gate of transistor 18 is energized and the A_ signal at the terminal of transistor 18 is transferred to the address factor. Otherwise, when fuse 24 is blown, the gate of transistor 20 is energized and the A signal is transferred to the address factor. After receiving a start up pulse, at the gate of transistor 14, signals are produced as address factors RA0 through RA11 which are each input into the inverters from the plurality of inverters 6. In order to activate a redundancy memory cell, address factors RA0 through RA11 are all at a logic 0 level such that a logic low signal results at the output of inverter 8. Address bit signals A12 and A_12 with fuses 4 function as discussed with respect to the 4 meg scheme. The minimum number of fuses blown in the 16 meg scheme is one. The maximum number of fuses blown is thirteen, while the average number of fuses blown is seven. In the drawing of FIGS. 2 there are fourteen fuses.

The main problem with the foregoing address redundancy match schemes is that the process of blown fuses takes a considerable amount of process time. Therefore, an address redundancy match scheme is needed that minimizes the number of blown fuses needed.

DETAILED DESCRIPTION OF THE INVENTION

The invention's redundancy address match scheme functions such that redundancy activation depends upon the selection of fuses to be blown corresponding to either the ones or the zeros in an address. For instance, chart A below illustrates a four bit address and indicates the number of fuses blown according to a scheme that blows fuses corresponding to the zeros in an address. In comparison, as shown, the number of fuses blown in the new scheme is considerably less. The new scheme interchangeably switches from logic zero address-blown fuse correspondence to logic one address-blown fuse correspondence. This scheme results in blowing the minimum number of fuses as selected between matching ones or zeros in an address. For instance, for the case with address 0010, then old scheme would blow fuses corresponding to the three zeros thereby resulting in 3 fuses blown. The invention's new scheme would only blow the fuse corresponding to the one and a fuse which allows the circuit implementing the scheme to switch from matching based on zeros to matching based on ones. With a four bit address, the average number of fuses blown is two for the prior art scheme while the new scheme averages 1.56 blown fuses. This type of comparison increasingly favors the new scheme as the number of bit positions in the address increases.

CHART A

| A3 | A2 | A1 | A0 | # of fuses blown corresponding to 0's in the address | # of fuses blown in new scheme |
|---|---|---|---|---|---|
| 0 | 0 | 0 | 0 | 4 | 1 |
| 0 | 0 | 0 | 1 | 3 | 2 |
| 0 | 0 | 1 | 0 | 3 | 2 |
| 0 | 0 | 1 | 1 | 2 | 2 |
| 0 | 1 | 0 | 0 | 3 | 2 |
| 0 | 1 | 0 | 1 | 2 | 2 |
| 0 | 1 | 1 | 0 | 2 | 2 |
| 0 | 1 | 1 | 1 | 1 | 1 |
| 1 | 0 | 0 | 0 | 3 | 2 |
| 1 | 0 | 0 | 1 | 2 | 2 |
| 1 | 0 | 1 | 0 | 2 | 2 |
| 1 | 0 | 1 | 1 | 1 | 1 |
| 1 | 1 | 0 | 0 | 2 | 2 |
| 1 | 1 | 0 | 1 | 1 | 1 |
| 1 | 1 | 1 | 0 | 1 | 1 |
| 1 | 1 | 1 | 1 | 0 | 0 |

Figure 3A:
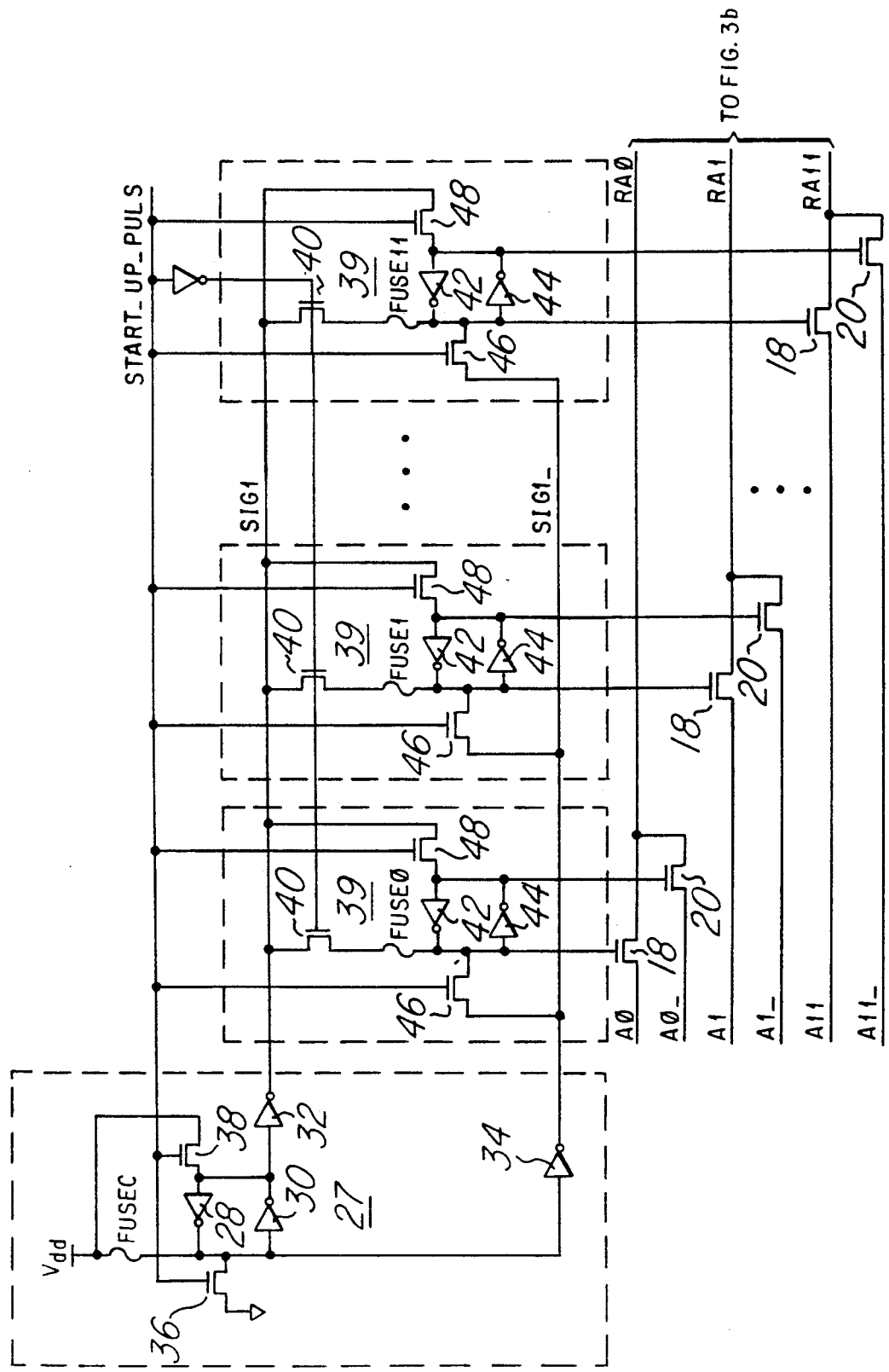
FIG. 3a and 3b illustrate a schematic drawing of the invention's redundancy address match circuit.
Figure 3B:
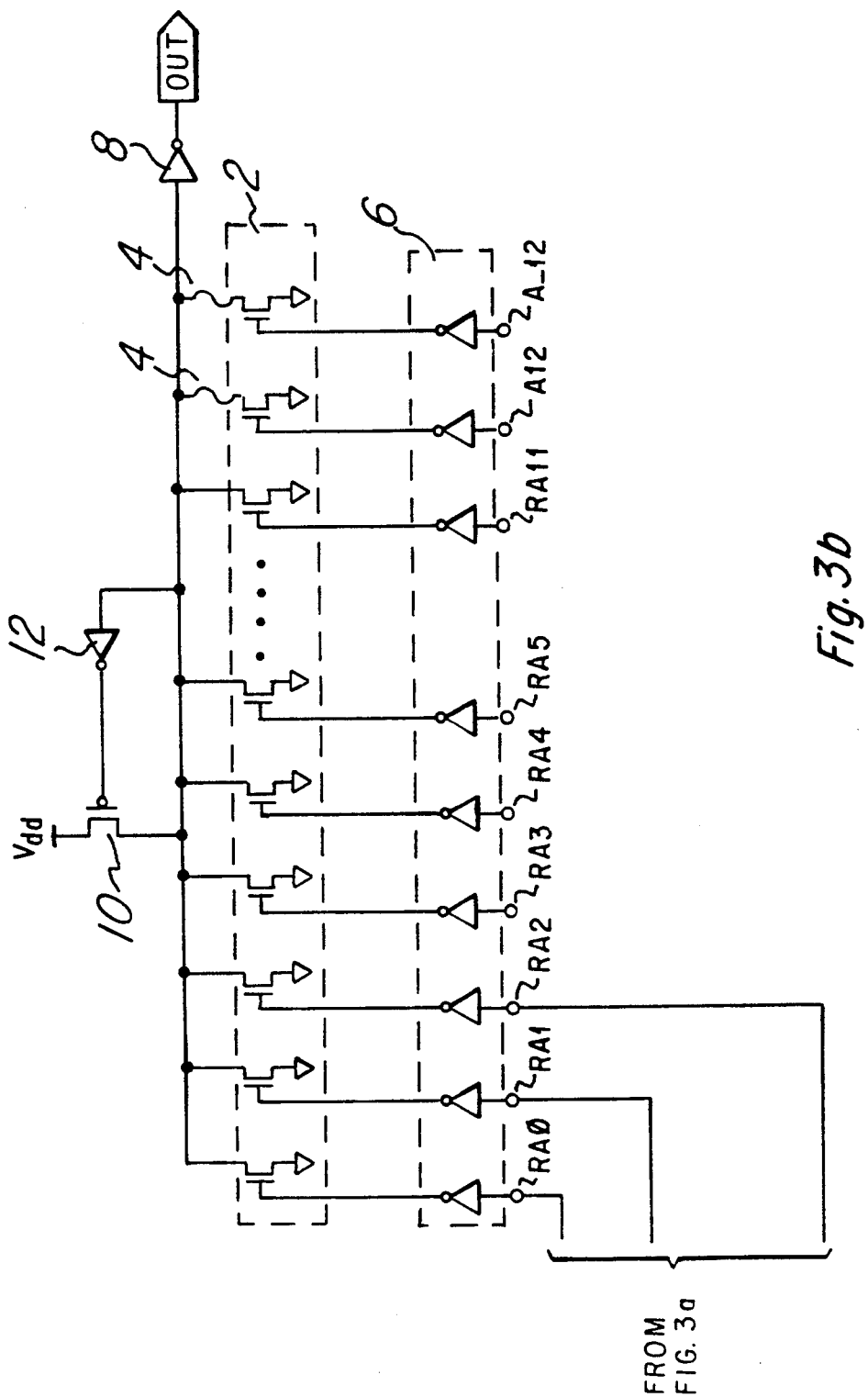

FIG. 3 illustrates a schematic drawing of the preferred embodiment of the invention's redundancy address match circuit for a memory such as a high density DRAM, i.e. 16 megabit, 64 megabit and beyond, which implements the new scheme as discussed above.

Figure 1:
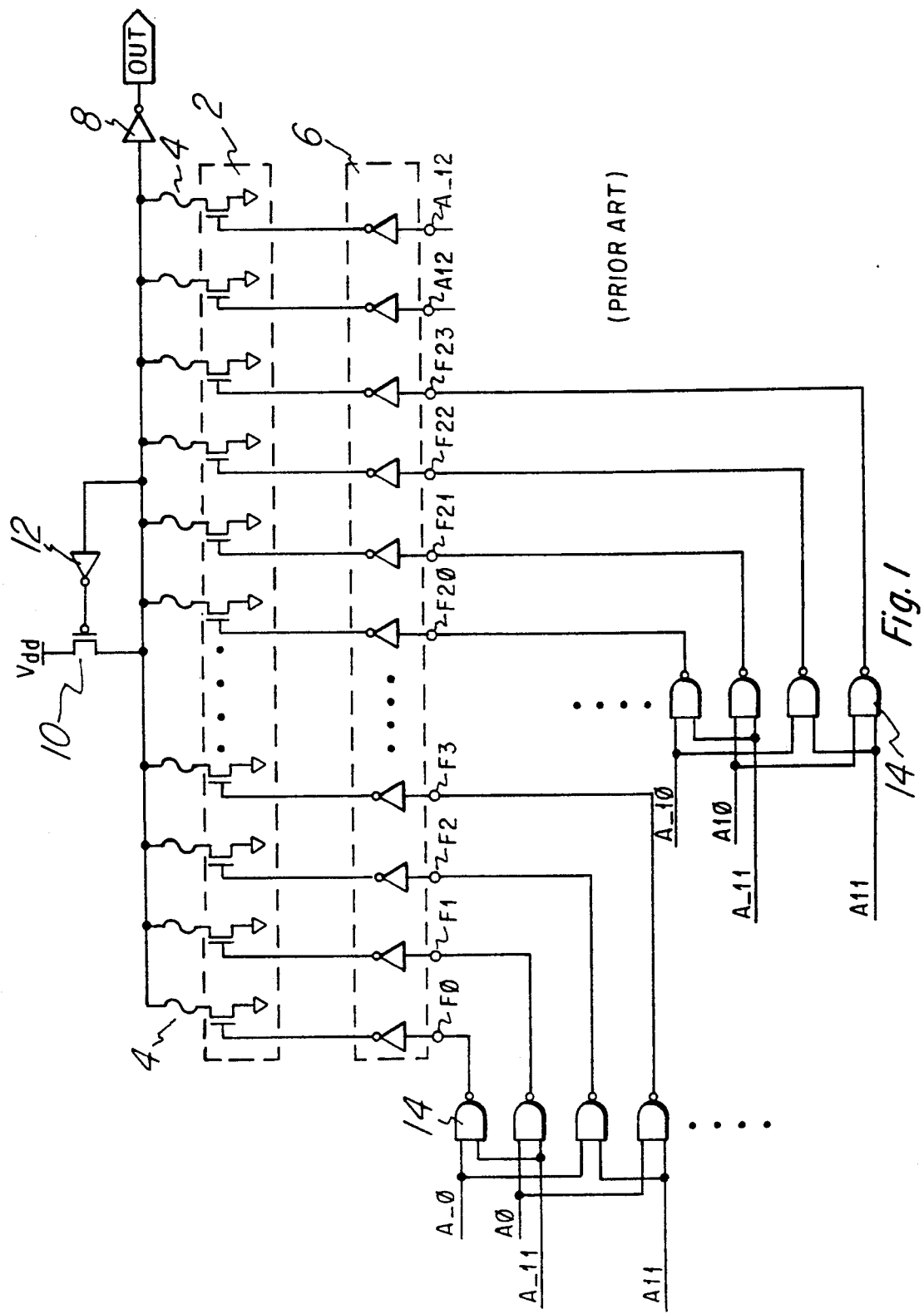
FIG. 1 illustrates a schematic drawing of a prior art address match scheme for a 4 megabit DRAM.
Figure 2:
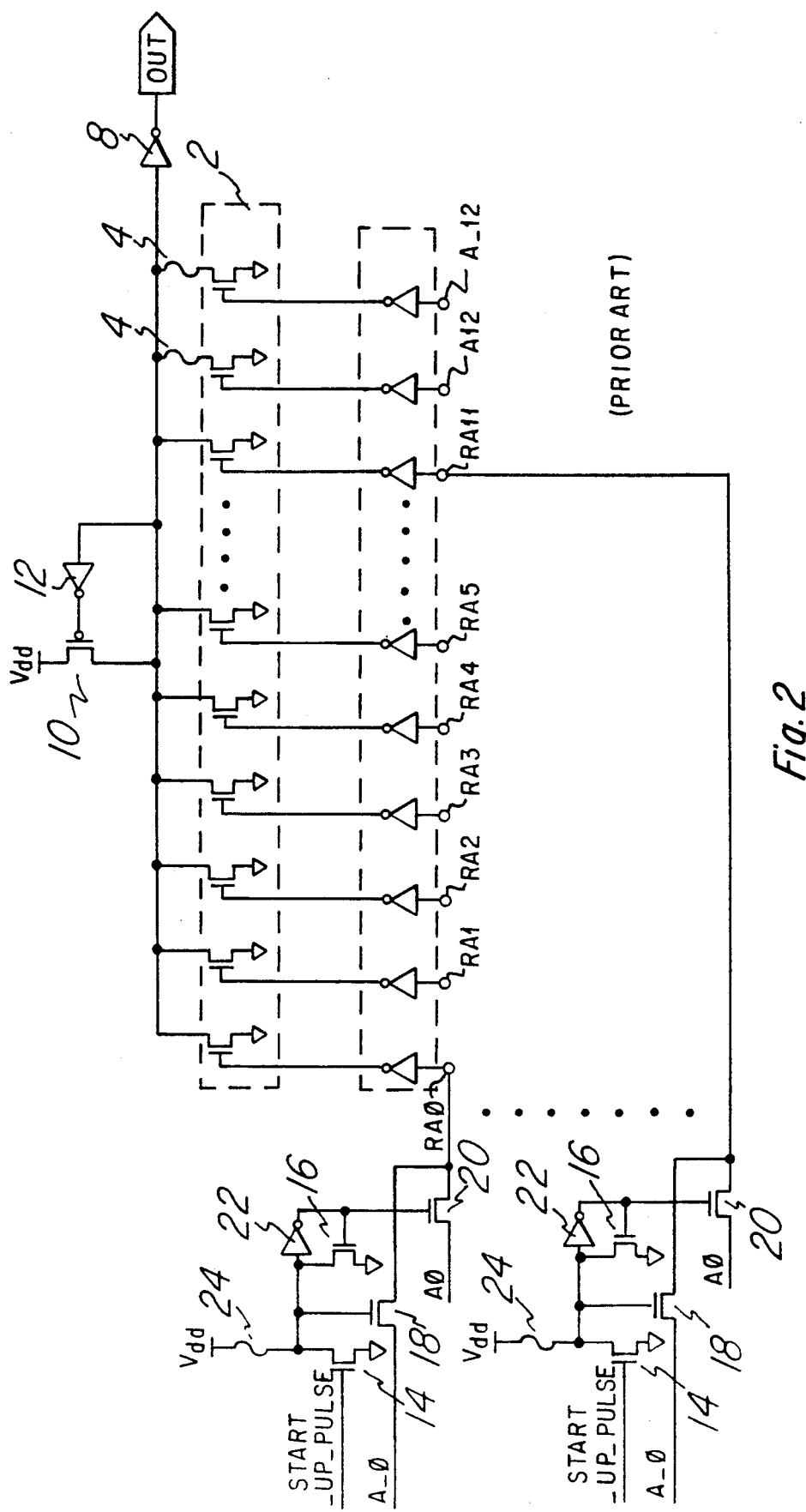
FIG. 2 illustrates a schematic drawing of a prior art 16 megabit DRAM type address match scheme.

Sub-circuit 27 comprising cross-coupled inverters 28 and 30, inverters 32 and 34, n-channel transistors 36 and 38 and fuse FUSEC controls the selection between a scheme based on blowing fuses corresponding to a logic one in an address or a scheme based on blowing fuses corresponding to a logic zero in an address. Fuse0 through Fuse11 are fuses that are each a part of a sub-circuit 39 comprised of n-channel transistor 40, cross-coupled inverters 42 and 44 (the input of one inverter connected to the output of the other inverter and vice-versa), and n-channel transistors 46 and 48. Fuses FUSE0 through FUSE11 are blown according to the scheme dictated by the condition (blown or not blown) of fuse FUSEC. Accordingly, either FUSE0 through FUSE11 are blown as determined by fuse FUSEC if the associated address bits are logic zeros or the associated address bits are logic ones. Fuse FUSEC is blown when the number of address bits in a logic 0 state is greater than one. Consequently, if FUSEC is blown, fuses FUSE0 through FUSE11 are blown when the corresponding address bit A signal (as opposed to the A signal) is a logic 1. Alternatively, if FUSEC is not blown, fuses FUSE0 through FUSE11 are blown when the corresponding address bit A_ signal is a logic 0. Illustrative of the case where FUSEC is not blown, in connection with a start up pulse, cross-coupled inverters 28 and 30 reinforce the logic high signal through fuse FUSEC from supply voltage Vdd, consequently, signal line SIG1 is at a logic high level while signal line SIG1_ is at a logic low level. Should, for instance, the signal at address bit A0 be at a logic high level, fuse FUSE0 is not blown, and this signal results in the logic high signal at address factor RA0. On the other hand, if A0 is at a logic low level, fuse FUSE0 is blown, and logic low level from line SIG1_ is reinforced through constructive feed back by cross-coupled inverters 42 and 44 such that the gate of transistor 18 is not energized, and such that the gate of transistor 20 is energized by the constructive feedback produced by inverters 42 and 44 resulting in the logic high level of the A_ 0 signal producing the RA0 address factor. Illustrative of the case where fuse FUSEC is blown, the constructive feed back of inverters and 30 cause a logic low signal to be produced at signal line SIG1 and a logic high signal to be produced at signal line SIG1_ since transistor 36 pulls the input of inverter 30 down to a logic low level in connection with the receipt of a start up pulse by transistor 36's gate. The start up pulse also locks in a high logic level to the input of transistor 44 and the output of transistor 42. If address bit A0 is a logic 0, fuse FUSE0 is not blown and the gate of transistor 20 is energized. The signal at bit A0_ produces address factor RA0. However, if address A0 is at a logic high level, fuse FUSE0 is blown, preventing line SIG1 from pulling down in voltage the gate of transistor 18, thereby allowing A0 to produce address factor RA0. Note that inverter 50 ensures proper operation after the receipt of the start up pulse by the circuit shown in FIG. 3. The gates of transistor 40 are turned off during the time the state of the cross-coupled inverters is established by the start up pulse. The start up pulse primarily sets the states of the cross-coupled inverters in FIG. 3. After the start up pulse has past, the gates of transistors 40 are energized through inverter 50 and the state of the corresponding fuse FUSE0 through FUSE 11 determines in part whether the gates of transistors 18 and 20 are energized. The address factors RA0 through RA11 are input into the circuit of FIG. 3b which is the same as that shown in FIG. 2.

Figure 4:
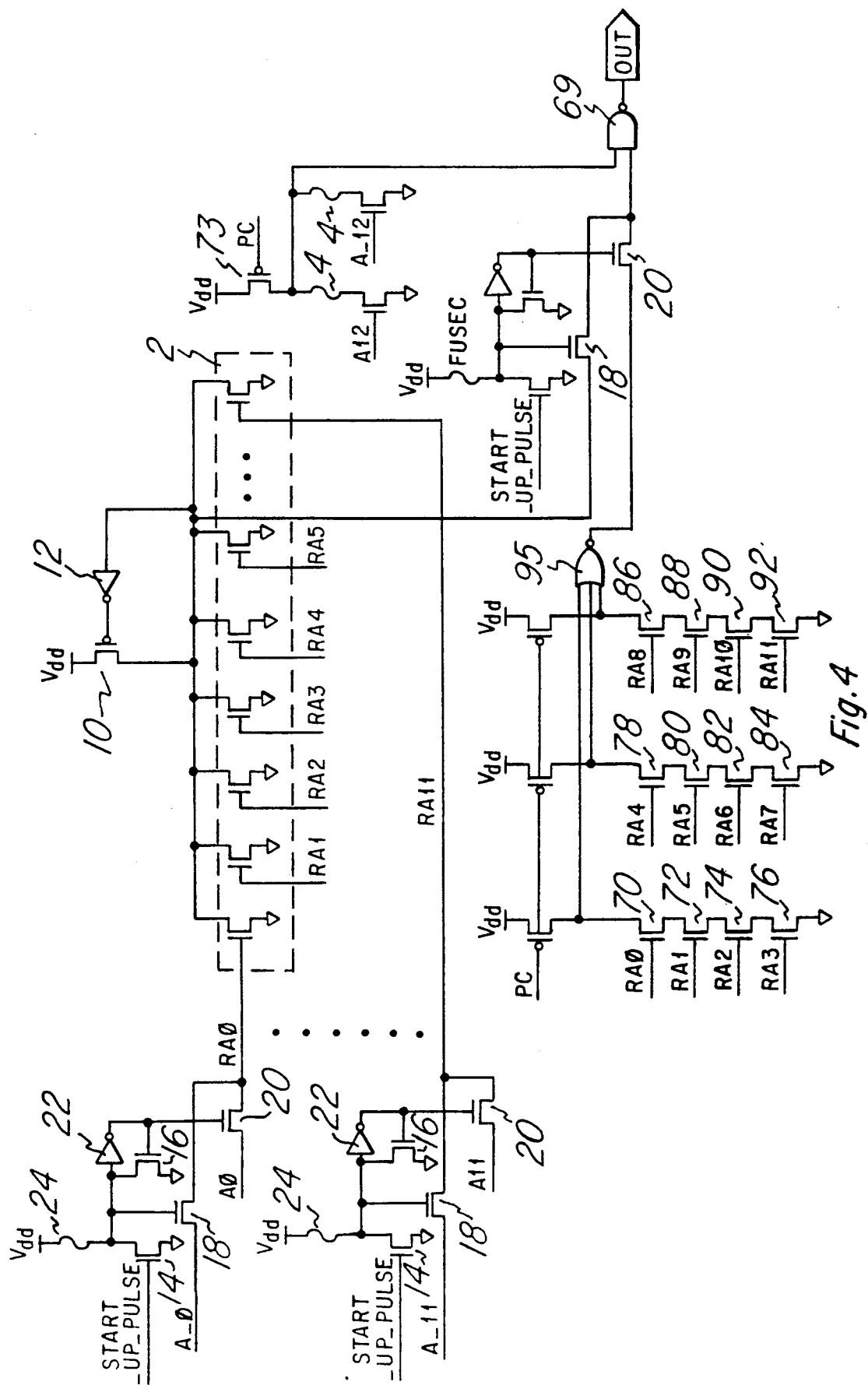
FIG. 4 illustrates a schematic drawing of an alternative embodiment of the invention's redundancy address match circuit.

An alternative embodiment of the invention is shown in the schematic drawing of FIG. 4. This circuit is similar to the circuit of FIG. 3a and 3b. However, NAND logic is used in combination with NOR logic to implement the match scheme, along with the circuit similar to subcircuit 27 of FIG. 3 being placed after the processing circuitry for determining address factors RA0 through RA11. The left half of the circuit in FIG. 4 is similar to that shown in the left-most portion of FIG. 2 except that fuse 24 is blown when fuse FUSEC is not blown and the associated A address bit is a logic zero. Alternatively, fuse 24 is blown when fuse FUSEC is not blown and the associated address bit is a logic one. Fuse FUSEC is blown when the number of logic zero A addresses (as opposed to A_ addresses) is greater than one. Illustrative of a redundancy match case where fuse FUSEC is not blown, the gate of transistor 14 receives a start up pulse. If address bit A, for instance A0, is a logic 0, then fuse 24 for this address bit is blown, a high logic level is placed at the gate of transistor 20 by the output of inverter 22 and address factor RA0 is a logic 0. In order to match the address for redundancy replacement of the usual memory location, all address factors RA0 through RA11 must be produced as logic low signals. Since fuse FUSEC has not been blown, transistor 18 receives a high logic signal at its gate and a low logic level is received at the gate of transistor 20. Therefore, the high logic level from transistor 18 received from the logic high node at the drain connections of transistors 2 is input to one terminal of NAND gate 69. When signal PC to the gate of p-channel transistor 73 is at a logic high level, transistor 73 turns off. However, during signal PC logic low levels, transistor 73 turns on to connect supply voltage Vdd to the other terminal of NAND gate 69. Signal PC can be derived from a precharge signal such as one commonly found in memories, for instance, a DRAM. Transistor 69 outputs a logic low level at node OUT, thereby indicating a redundancy address match. Illustrative of the case where fuse FUSEC is blown, RA0 through RA11 are determined as indicated above. Consequently, RA0 through RA11 are all at a logic high level during times of a redundancy address match for replacement of defective memory. N-channel transistors 70 through 92 (labeled consecutively and evenly as shown), pull down the inputs to NOR gate 95 during times of address match. By fuse FUSEC's having been blown, the gate of transistor 20 is energized and the high signal through transistor 73 during times signal PC is at a logic low level, produces two logic high level inputs to the input of NAND gate 69. This produces a logic low level at output OUT, thereby indicating a redundant address match.

Although the invention has been described in detail herein with reference to its preferred embodiment, it is to be understood that this description is by way of example only is not to be construed in a limiting sense. It is to be further understood that numerous changes in the details of the embodiments of the invention, and additional embodiments of the invention, will be apparent to, and may be made by persons of ordinary skill in the art having reference to this description. For instance, although the foregoing invention has been described with regard to a DRAM, it may be used as a redundancy scheme for any memory including read only memories and static random access memories. Additionally, p-channel transistors can be substituted for n-channel transistors and vice versa. Additionally, bipolar transistors can be substituted for field effect transistors. Further the field effect transistors referenced herein can be MOS transistors. The foregoing described scheme can be made on an integrated circuit using commonly known semiconductor fabrication techniques. It is contemplated that all such changes and additional embodiments are within the true scope and spirit of the invention as claimed below.

We claim:

1. An address match scheme for using redundant memory, comprising:
    a first sub-circuit including a fuse, said first sub-circuit further including a pair of cross-coupled inverters and a pair of switches, said switches being operable in connection with said fuse of said first sub-circuit to set a logic state at the input of each inverter of said cross-coupled inverters;
    a first signal line coupled to said first sub-circuit;
    a second signal line coupled to said first sub-circuit, operable to carry the complement of a signal on said first signal line, said signal lines being coupled to said fuse through said cross-coupled inverters;
    at least one second sub-circuit coupled to said first and second signal lines, said second sub-circuit including a fuse;
    said fuse of said first sub-circuit being blowable such that said fuse of said second sub-circuit can be interchanged between a scheme based on matching logic zeroes in an address and a scheme based on matching logic ones in an address.

2. An address match scheme for using redundant memory, comprising:
    a first sub-circuit including a fuse;
    a first signal line coupled to said first sub-circuit;
    a second signal line coupled to said first sub-circuit, operable to carry the complement of a signal on said first signal line;
    at least one second sub-circuit coupled to said first and second signal lines, said second sub-circuit including a fuse, said at least one second sub-circuit further including a pair of cross-coupled inverters and a pair of switches, said switches being operable to set a logic state at the input of each inverter of said cross-coupled inverters of said at least one second sub-circuit;
    said fuse of said first sub-circuit being blowable such that said fuse of said second sub-circuit can be interchanged between a scheme based on matching logic zeroes in an address and a scheme based on matching logic ones in an address.

3. An address match scheme as recited in claim 2 which further comprises at least one pair of switches, each switch from said at least one pair of switches being operable to transmit an address signal and the complement of said address signal to an associated transistor connected to a third signal line.

* * * * *